United States Patent
Khawas et al.

(10) Patent No.: US 11,916,555 B2
(45) Date of Patent: Feb. 27, 2024

(54) FLIP-FLOP WITH INTERNAL CIRCUIT FOR GENERATING INFLATED LOW AND HIGH PULSE WIDTH SIGNALS

(71) Applicant: TEXAS INSTRUMENTS INCORPORATED, Dallas, TX (US)

(72) Inventors: Arnab Khawas, Bangalore (IN); Badarish Subbannavar, Bangalore (IN); Gokul Sabada, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 115 days.

(21) Appl. No.: 17/490,241

(22) Filed: Sep. 30, 2021

(65) Prior Publication Data
US 2023/0100019 A1    Mar. 30, 2023

(51) Int. Cl.
*H03K 3/037* (2006.01)
*H03K 3/012* (2006.01)

(52) U.S. Cl.
CPC ............ *H03K 3/037* (2013.01); *H03K 3/012* (2013.01); *H03K 3/0372* (2013.01)

(58) Field of Classification Search
CPC ........ H03K 3/012; H03K 3/017; H03K 3/037; H03K 3/0372; H03K 3/356; H03K 3/3562; H03K 3/35625; H03K 5/04–06; H03K 23/50; H03K 23/54; H03K 23/542
See application file for complete search history.

(56) References Cited

U.S. PATENT DOCUMENTS

| | | | | |
|---|---|---|---|---|
| 6,608,513 | B2 * | 8/2003 | Tschanz | H03K 3/356156 327/171 |
| 7,358,786 | B2 * | 4/2008 | Kim | G01R 31/318575 327/212 |
| 8,970,274 | B2 * | 3/2015 | Geisler | H03K 3/356113 327/239 |
| 9,559,669 | B1 * | 1/2017 | Gaide | H03K 5/05 |
| 2012/0235722 | A1 * | 9/2012 | Fujisawa | H03K 3/012 327/176 |
| 2014/0218092 | A1 * | 8/2014 | Luo | H03K 3/012 327/262 |
| 2020/0106425 | A1 * | 4/2020 | Venugopal | G06F 1/28 |

* cited by examiner

*Primary Examiner* — Patrick O Neill
(74) *Attorney, Agent, or Firm* — John R. Pessetto; Frank D. Cimino (57) ABSTRACT

Example flip-flops comprise a circuit that receives a primary clock signal, generates a clock buffer signal having a series of pulses, each delayed by a set amount of time relative to a corresponding pulse of the primary clock signal, generates an intermediate clock signal based on the primary clock signal and the clock buffer signal, generates inflated low pulse width clock signals, each having a low pulse width that is greater than a low pulse width of the primary clock signal. Latch stages within example flip-flops include one or more components that are controlled by the inflated low pulse width clock signals. Example flip-flops include high-speed flip-flops and standard flip-flops. Larger circuits, such as a clock divider circuits, may incorporate multiple example high-speed flip-flops to improve performance.

12 Claims, 6 Drawing Sheets

FLIP-FLOP WITH INTERNAL CIRCUIT FOR GENERATING INFLATED LOW AND HIGH PULSE WIDTH SIGNALS

FIELD OF DISCLOSURE

This disclosure relates generally to flip-flops with clock minimum pulse width (MPW) improvement, and more particularly to flip-flops having internal circuits for generating inflated low pulse width (LPW) clock signals and inflated high pulse width (HPW) clock signals for use in the flip-flops, e.g., high-speed flip-flops.

BACKGROUND

Flip-flop circuits (flip-flops) are an integral part of digital circuits, and in particular the timing circuits therein. With increasing demand for high-speed systems, high-speed flip-flops were developed. High-speed flip-flops may be used to implement a frequency divider, which is an important component of a high-speed communication system.

To ensure proper functionality of a flip-flop, the pulse width of the controlling clock signal must be wide enough for the flip-flop to properly complete its internal operation(s). The minimum pulse width (MPW) represents the minimum permissible pulse width for both high and low levels of the clock signal for the flip-flop to generate a proper output and to avoid entering a metastable state. MPW may be applied individually to the high and low pulses of a clock signal, in which case there is minimum low pulse width and a minimum high pulse width. The minimum low pulse width is higher for high-speed flip-flops than for standard flip-flops, because of the delayed clock used in the master latch entry and latch control to improve the set-up time.

Thus, in a D-type high-speed flip-flop to improve the set-up time requirement, internal functional clock signals, derived from a primary clock signal and a scan signal complement, are typically delayed with respect to the primary clock signal, and the scan multiplexer at the input is removed. The latter alteration also makes the path from the data input (i.e., "d") pin into the master latch faster. The delay of the functional clock signals, however, increases the LPW requirement, and hence the MPW requirement.

Consider a typical clock network that generates internal functional clock signals (clkf and its complement clkfz), from a primary clock signal (clk) input and complement scan signal (scanz). The signal path from the rising edge of primary clock signal (clk) to the rising edge of internal clock signal (clkf) (or the to the falling edge of its complement clkfz), typically includes three (3) transistors, whereas the signal path from the falling edge of primary clock signal (clk) to the falling/rising edge of (clkf/clkfz) typically includes four (4) transistors, two of which are in series. This results in a greater delay when the primary clock signal (clk) is falling than the delay when (clk) is rising. The two series-coupled transistors in the falling signal path exacerbates the difference. This delay difference, in turn, reduces the LPW of internal clock signal (clkf), relative to its HPW.

Thus, the LPW requirement on the primary clock pin for an existing high-speed flip-flop increases. Moreover, in conventional high-speed flip-flop architecture, the higher LPW can limit the maximum clock frequency. A solution to these issues is desirable.

SUMMARY

In an example, a flip-flop circuit comprises a first section (e.g., circuit 106/704) and a second section (e.g., latches 102/702). The first section is configured to receive a primary clock signal (e.g., clk), the first section being configured to generate a clock buffer signal (e.g., clkb) having a series of pulses, each delayed by a set amount of time relative to a corresponding pulse of the primary clock signal, generate an intermediate clock signal based on the primary clock signal and the clock buffer signal, generate an inflated low pulse width clock signal (e.g., clk_lpw) having a low pulse width that is greater than a low pulse width of the primary clock signal, and generate a complement inflated low pulse width clock signal (e.g., clkz_pw). The second section includes at least one component configured to receive the inflated low pulse width clock signal and the complement inflated low pulse width clock signal.

In an example, a circuit comprises n flip-flop circuits, where n is an integer greater than 1. Each of the n flip-flop circuits is configured to receive a primary clock signal. A first section of each flip-flop circuit is configured to generate a clock buffer signal having a series of pulses, each delayed by a set amount of time relative to a corresponding pulse of the primary clock signal, generate an intermediate clock signal based on the primary clock signal and the clock buffer signal, generate an inflated low pulse width clock signal having a low pulse width that is greater than a low pulse width of the primary clock signal, and generate a complement inflated low pulse width clock signal, the inflated low pulse width clock signal and the complement inflated low pulse width clock signal being applied internally in the circuit.

In an example, a method comprises: generating a clock buffer signal based on a primary clock signal, the clock buffer signal having a series of pulses, each delayed by a set amount of time relative to a corresponding pulse of the primary clock signal; generating an intermediate clock signal based on the primary clock signal and the clock buffer signal; generating, based on the intermediate clock signal, an inflated low pulse width clock signal having a low pulse width that is greater than a low pulse width of the primary clock signal; and generating a complement inflated low pulse width clock signal.

These and other features will be better understood from the following detailed description with reference to the accompanying drawings.

BRIEF DESCRIPTION OF THE DRAWINGS

Features of the disclosure may be understood from the following figures taken in conjunction with the detailed description.

The same reference numbers are used in the drawings to designate the same or similar (structurally and/or functionally) features.

DETAILED DESCRIPTION

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

In example arrangements, various flip-flops, both high-speed and standard-speed, are provided. In some examples, a flip-flop is configured to reduce the low pulse width (LPW) requirement on the primary clock pin, by generating signals with inflated low pulse widths. In some examples, the internal circuit generating the inflated-LPW signals is configured such that the low pulse width of the generated signals is greater than their high pulse width. In some examples, a flip-flop is configured to generate inflated high pulse width (HPW) signals, in which the HPW is greater than the LPW. In some examples, a flip-flop is configured such that its maximum operating frequency is limited by the LPW of the generated signals, or, when both inflated-LPW and inflated-HPW signals are generated, by the worse of the LPW of the inflated-LPW signal and the HPW of the inflated-HPW signal. In some examples, a flip-flop is configured to attain a higher operating frequency using LPW-generated signals. In some examples, such higher operating frequency is attained without appreciably affecting set-up/hold times or the delay from assertion of the primary clock signal at an input to generation of an output, e.g., "q" in a D-type flip-flop. Example flip-flops described herein may be incorporated into system level components, e.g., clock divider/multiplier circuits, to improve performance at the system level.

Figures 1A, 1B:
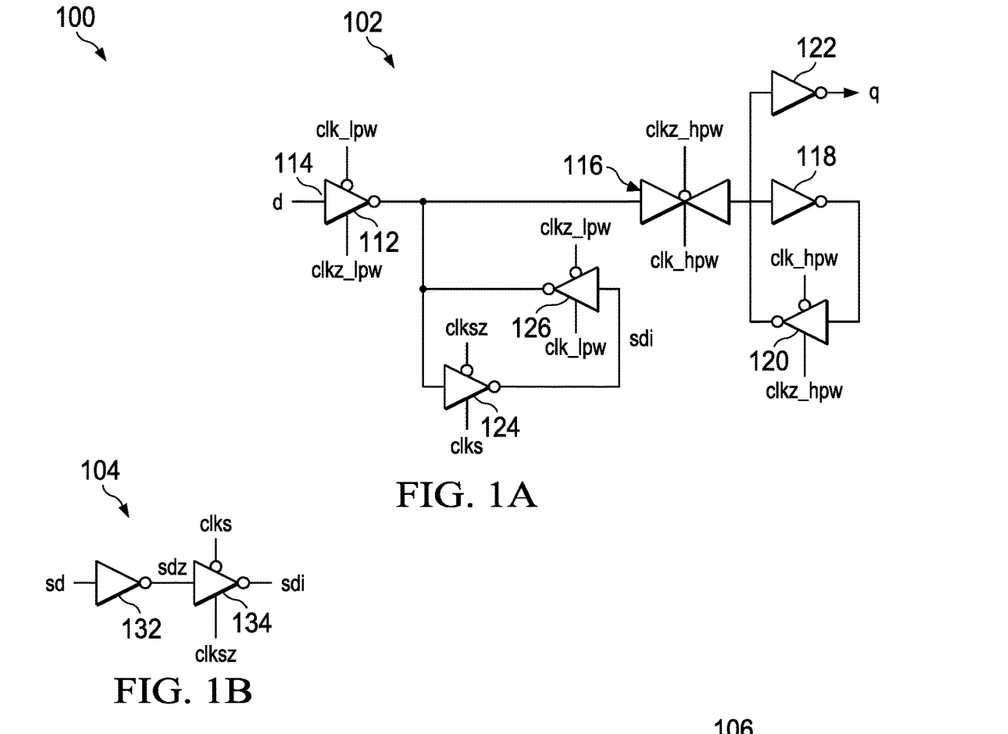
FIGS. 1A, 1B, 1C, 1D and IE are schematic diagrams of various sections of an example high-speed flip-flop.
Figure 1C:
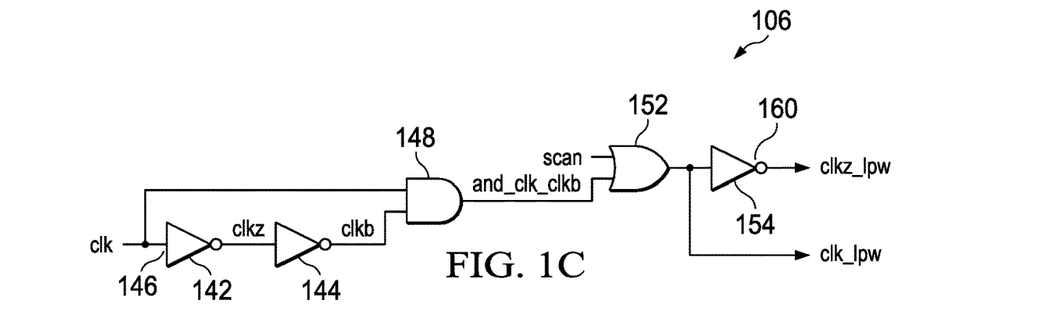
Figure 1D:
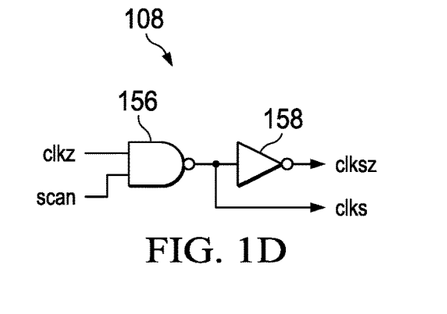
Figure 1E:
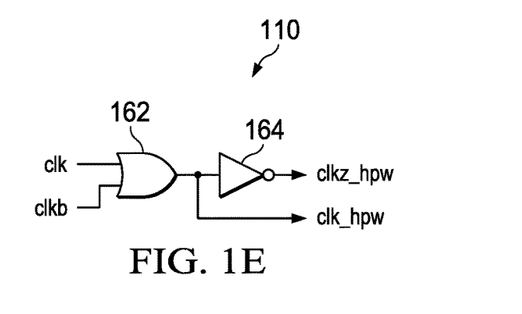

FIG. 1A is a schematic diagram of latch stages 102 of an example high-speed flip-flop 100, FIG. 1B is a schematic diagram of a circuit 104 configured to generate internally-used serial data interface signals (sdi) during scan mode of high-speed flip-flop 100, FIG. 1C is a schematic diagram of a circuit 106 configured to generated a pair of complementary signals for internal use, each such signal having an inflated LPW, FIG. 1D is a schematic diagram of a circuit 108 configured to generated other internally-used signals, and FIG. 1E is a schematic diagram of a circuit 110 configured to generate for internal use a pair of complementary signals, each having an inflated HPW. FIGS. 1A, 1B, 1C, 1D and 1E (collectively, FIG. 1) show components of example high-speed flip-flop 100. In this example, circuit 106 may be considered a first section of high-speed flip-flop 100, latch stages 102 may be considered a second section of high-speed flip-flop 100, and circuit 110 may be considered a third section of high-speed flip-flop 100.

Referring to FIG. 1A, latch stages 102 include input tri-state inverter 112 having an input 114 at which a data signal (d) is received. Input tri-state inverter 112 is controlled by inflated low pulse width (LPW) clock signals (clk_lpw and clkz_lpw), the latter of which is the complement of the former, generated by circuit 104 shown in FIG. 1B. The output of input tri-state inverter 112 is coupled to an input of a transmission gate 116, which is controlled by a inflated high pulse width (HPW) clock signal (clk_hpw) and its complement (clkz_hpw), which signals are generated by circuit 110 shown in FIG. 1E. The output of transmission gate 116 is coupled to the input of inverter 118, the output of which is, in turn, coupled to the data input of tri-state inverter 120 that is controlled by inflated HPW clock signal (clk_hpw) and its complement (clkz_hpw). The output of tri-state inverter 120 is coupled to an inverter 122 having an output at which output signal (q) is output. A tri-state inverter is sometimes referred to as a clocked inverter.

Latch stages 102 also include a regenerative loop coupled to the output of input tri-state inverter 112. The loop includes a pair of tri-state inverters 124 and 126 for generating serial data interface signals (sdi) during functional mode of operation, i.e., when the scan signal (scan) is a static 0. Tri-state inverter 124 is controlled by a pair of complementary clock signals (clks and clksz), which signals are generated by circuit 108 shown in FIG. 1D. As with tri-state inverter 114, tri-state inverter 126 is also controlled by complementary signals (clk_lpw and clkz_lpw) generated by circuit 106 shown in FIG. 1C.

Circuit 104, shown in FIG. 1B, is an alternate way of generating serial data interface signals (sdi) during scan mode, as is known in the art. Circuit 104 includes an inverter 132 coupled to a tri-state inverter 134. Serial data signal (sd) is asserted at the input of inverter 132 to generate complement serial data signal (sdz), (i.e., the complement of sd), which is then applied to the data input of tri-state inverter 134, which is controlled by complementary clock signals (clks and clksz) generated by circuit 108 shown in FIG. 1D.

Figure 2:
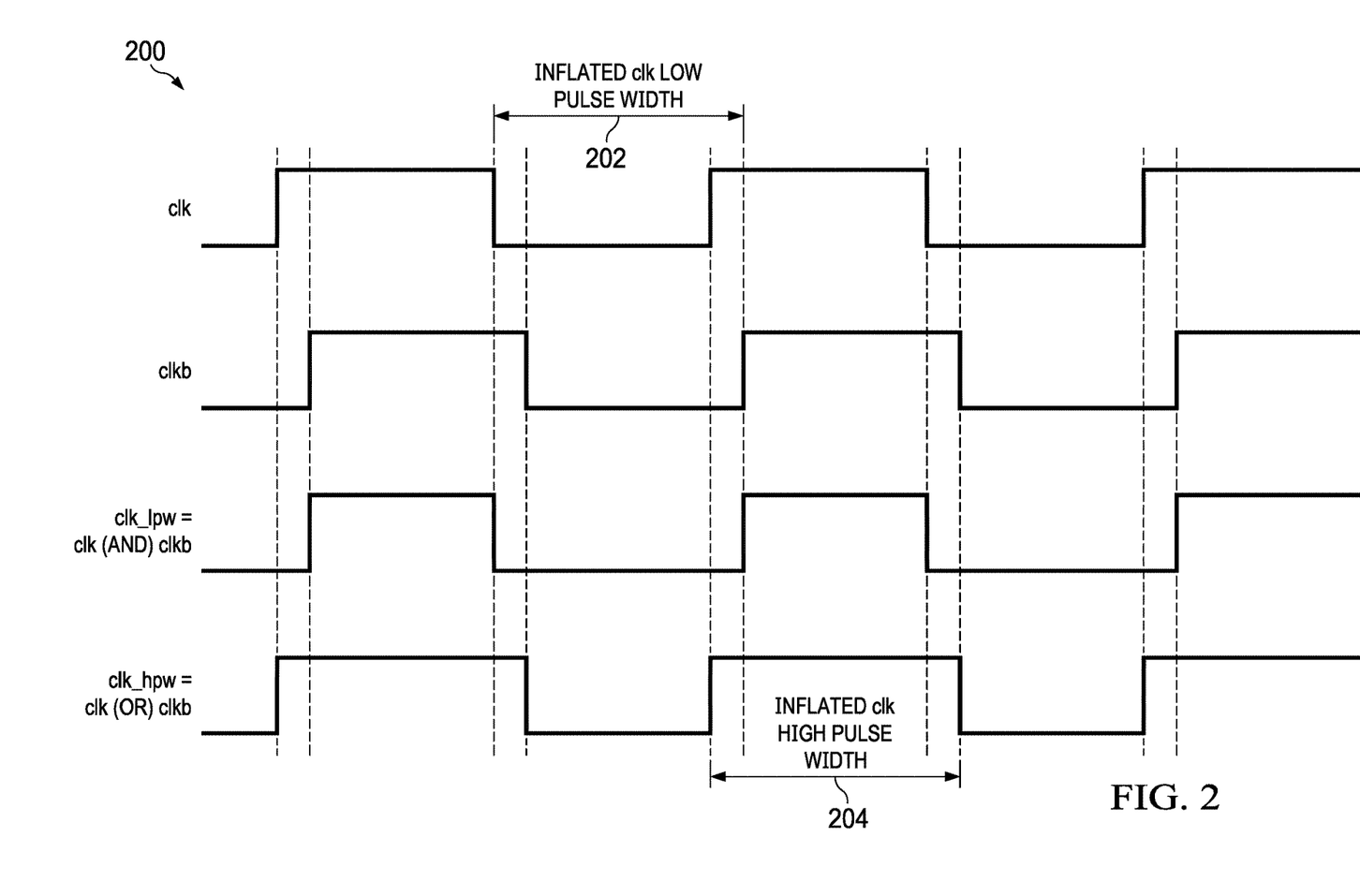
FIG. 2 is a diagram illustrating portions of the waveforms of a primary clock signal, a generated clock buffer signal and a generated inflated low pulse width clock signal.

Referring now to FIG. 1C, circuit 106 is configured to generate a clock signal having an inflated low pulse width (clk_lpw). Its low pulse width (LPW) is greater than the LPW of primary clock signal (clk), as shown in FIG. 2. Circuit 106 is also configured to generate a complement inflated low pulse width clock signal (clkz_lpw). In an example, circuit 106 includes a pair of series-coupled front-end inverters 142 and 144. Inverter 142 has an input 146 at which primary clock signal (clk) is received. Its complement (clkz) is generated at the output of inverter 142 and input to inverter 144. A delayed buffer clock signal (clkb) is generated at the output of inverter 144. Circuit 106 also includes an AND gate 148 that receives primary clock signal (clk) at one input and delayed buffer clock signal (clkb) at another input. From those inputs, AND gate 148 generates an intermediate clock signal denoted "and clk clkb". This intermediate clock signal is input to OR gate 152, along with a scan signal (scan), which in functional mode is a static 0. From these inputs, OR gate 152 generates inflated LPW clock signal (clk_lpw). The complement of LPW clock signal (clkz_lpw) is generated at output 160 of inverter 154, the input of which is coupled to the output of OR gate 152.

Circuit 108 shown in FIG. 1D generates another pair of complementary signals (clks and clksz), based on complement primary clock signal (clkz) and the scan signal (scan), as is known in the art. The latter two signals form the inputs to a NAND gate 156, the output of which is coupled to the input of an inverter 158. The signal (clks) is generated at the output of NAND gate 156, and the complement signal (clksz) is generated at the output of inverter 158.

FIG. 1E shows circuit 110, which is configured to generate inflated HPW clock signals (i.e., clk_hpw and clkz_hpw) based on primary clock signal (clk) and delayed buffer clock signal (clkb). These signals (clk and clkb) are input to an OR gate 162, which generates inflated HPW clock signal (clk_hpw). The input of inverter 164 is coupled to the output of OR gate 162 to generate complement inflated HPW clock signal (clkz_hpw).

FIG. 2 shows portions of the waveforms 200 of primary clock signal (clk), clock buffer signal (clkb), inflated LPW clock signal (clk_lpw), and inflated HPW clock signal (clk_hpw). Inflated LPW clock signal (clk_lpw) is equivalent to the output of logically combining primary clock signal (clk) and clock buffer signal (clkb) via an AND operation, and inflated HPW clock signal (clk_hpw) is equivalent to the output of logically combining primary clock signal (clk) and clock buffer signal (clkb) via an OR operation.

As can be seen, inflated LPW clock signal (clk_lpw) has an inflated or increased LPW, indicated by reference numeral 202, relative to the low pulse width of primary clock signal (clk). In the illustrated example, the start of inflated LPW 202 coincides with the start of the low pulse of primary clock signal (clk) but remains in the low state for a set period of time after primary clock signal (clk) transitions to a high state. In inflated LPW clock signal (clk_lpw), the LPW is greater than the HPW. By generating and internally using inflated LPW clock signal (clk_lpw), as well as its complement (clkz_lpw), the LPW requirement on the primary clock signal pin is lessened or reduced.

As shown in FIG. 2, inflated HPW clock signal (clk_hpw) has an inflated or increased LPW, indicated by reference numeral 204, relative to the high pulse of primary clock signal (clk). In the illustrated example, the start of inflated HPW 204 coincides with the start of the high pulse of primary clock signal (clk) but remains in the high state for a set period of time after primary clock signal (clk) transitions to a low state. In inflated HPW clock signal (clk_hpw), the HPW is greater than the LPW.

The duration of inflated LPW 202 relative to the low pulse width of primary clock signal (clk) and relative to the high pulse width of inflated LPW clock signal (clk_lpw) may be set based on operating parameters of high-speed flip-flop 100. The duration of HPW 204 relative the high pulse width of primary clock signal (clk) and relative to the low pulse width of inflated HPW clock signal (clk_hpw) also may be set based on operating parameters of high-speed flip-flop 100.

With the configuration shown in FIG. 1, the maximum frequency of primary clock signal (clk) having a 50% duty cycle, and hence the maximum operating frequency of high-speed flip-flop 100, is a function of the maximum of the LPW of inflated LPW clock signal (clk_lpw) and the HPW of the inflated HPW clock signal (clk_hpw). In an example, the maximum operating frequency ($F_{max}$) is approximately equal to 1/(2*Max(HPW, LPW)).

Figure 3:
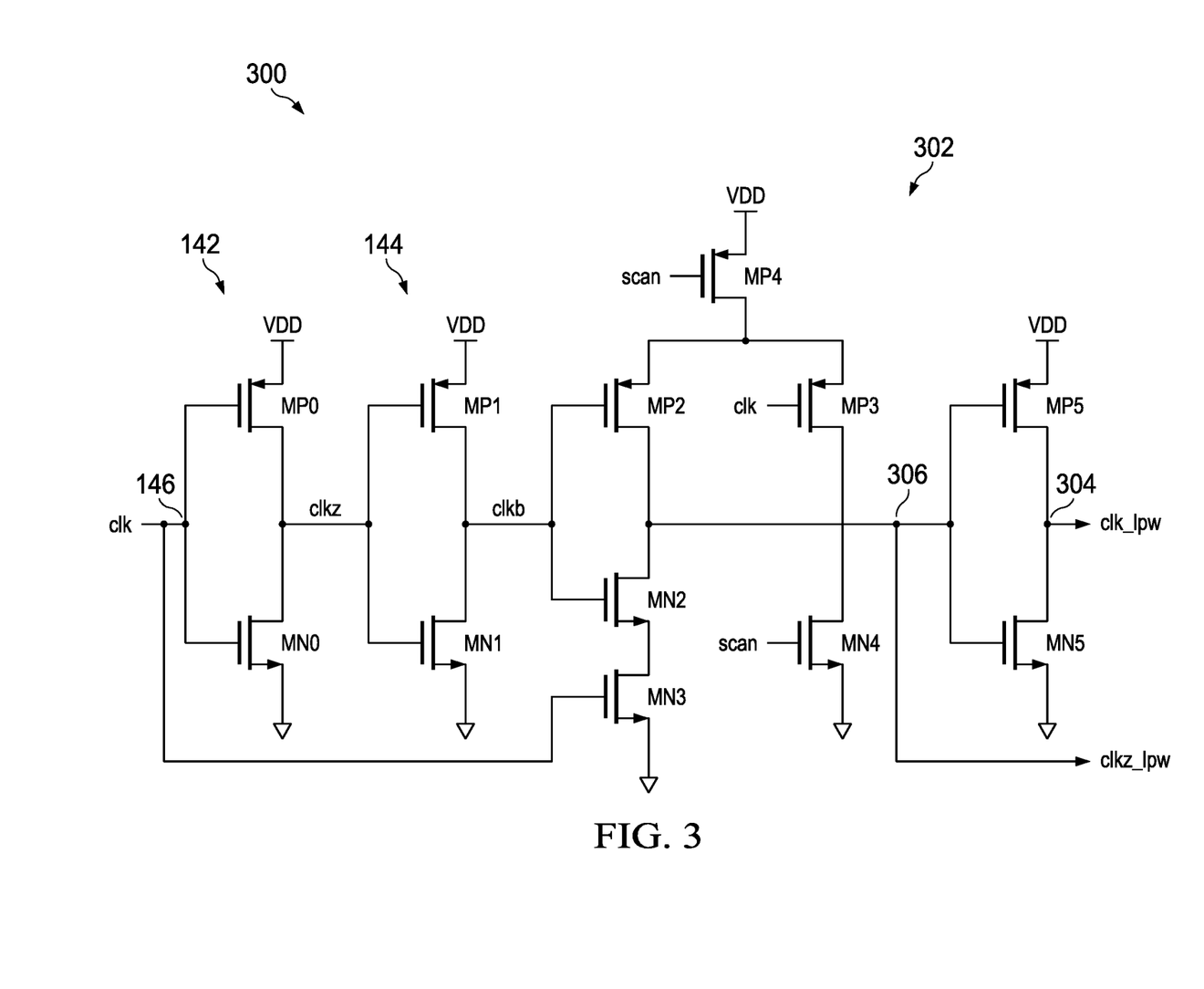
FIG. 3 is circuit diagram of an example circuit for generating internal clock signals with inflated low pulse widths for use in a high-speed flip-flop.

FIG. 3 shows an example transistor-level implementation (i.e., a circuit) 300 of the logic of circuit 106. Circuit 300 is optimized to use less transistors to implement the logic of circuit 106. Inverter 142 may be a complementary metal-oxide-semiconductor (CMOS) configuration, formed by a complementary pair of p-type and n-type metal-oxide-silicon field-effect transistors ("MOSFETS") denoted MP0 and MN0, respectively. The gates of MP0 and MN0 are coupled together to form input 146, where primary clock signal (clk) is applied. The drains of MP0 and MN0 are coupled together to form the output of inverter 142. The sources of MP0 and MN0 are coupled to a supply voltage, e.g., VDD, and ground, respectively. Inverter 144 is similarly constructed, using transistors MP1 and MN1. The commonly coupled gates of MP1 and MN1 form the input of inverter of 144 to receive the output of inverter 142, i.e., complement primary clock signal (clkz). The sources of MP1 and MN1 are coupled to VDD and ground, respectively. The commonly coupled drains of MP1 and MN1 form the output of inverter 144, at which clock buffer signal (clkb) is generated.

Structure 302 configured by transistors MP2-MP5 and MN2-MN5 implement the logic of AND logic gate 148, OR logic gate 152, and inverter 154 of FIG. 1C. MP2 and MN2 have commonly coupled gates which are also coupled to the output of inverter 144. Thus, clock buffer signal (clkb) is input to the gates of MP2 and MN2. The drain of MP2 is coupled to the drain of MN2, the source of which is coupled to the drain of MN3. The gate of MN3 forms an input at which primary clock signal (clk) is input. The source of MN3 is coupled to ground. The source of MP2 is coupled to the source of MN3 and also to the drain of MP4. The source of MP4 is coupled to VDD, and the gate of MP4 forms an input for scan signal (scan). The gate of MP3 is configured to receive primary clock signal (clk), and the drain of MP3 is coupled to the drain of MN4, the gate of which is configured to receive scan signal (scan). The source of MN4 is coupled to ground.

The commonly coupled drains of MP2 and MN2 are coupled to the gates of MP5 and MN5, and such node forms output 306 of circuit 300. Complement inflated LPW clock signal (clkz_lpw) is generated at output 306. The drains of MP5 and MN5 are coupled together to form another output 304 of circuit 300. Inflated LPW clock signal (clk_lpw) is generated at output 304. The sources of MP5 and MN5 are coupled to VDD and ground, respectively.

Figure 4:
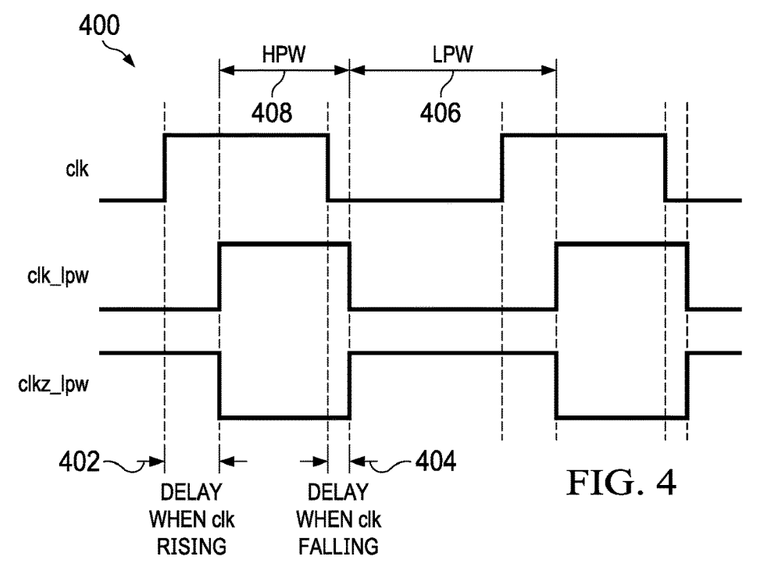
FIG. 4 is a diagram illustrating portions of the waveforms of a primary clock signal, a generated inflated low pulse width signal and a generated complement inflated low pulse width signal.

FIG. 4 shows portions of waveforms 400 of primary clock signal (clk), as well as of inflated LPW clock signal (clk_lpw) and its complement (clkz_lpw), which are generated by circuit 106. With both primary clock signal (clk) and inflated LPW clock signal (clk_lpw) in the low state, inflated LPW clock signal's (clk_lpw's) transition to the high state is delayed by a first set amount of time 402 relative to the corresponding high-state transition of primary clock signal (clk). Then, with both primary clock signal (clk) and inflated LPW clock signal (clk_lpw) in the high state, inflated LPW clock signal's (clk_lpw's) transition back to the low state is delayed by second set amount of time 404. Set amount of time 402 is greater than set amount of time 404, which results in the LPW 406 of inflated LPW clock signal (clk_lpw) being greater than the low pulse width of primary clock signal (clk) and also being greater than the HPW 408 of inflated LPW clock signal (clk_lpw).

The signal path from the start of the rise of primary clock signal (clk) to the start of the rise of inflated LPW clock signal (clk_lpw) (or to the start of the fall of its complement clkz_lpw), which corresponds to delay 402, includes five (5) transistors: MN0, MP1, MN2, MN3 and MP5. The number of transistors and the delay associated with each, as well as the fact that MN2 and MN3 are in series, accounts for delay 402. The signal path from the start of the fall of primary clock signal (clk) to the start of the fall of inflated LPW clock signal (clk_lpw) (or to the start of the rise of its complement clkz_lpw), which corresponds to delay 404, includes three (3) transistors: MP3, MP5 and MN5. As a result, delay 402 is greater than delay 404. Thus, the configuration of circuit 106 generates signals with an inflated LPW relative to their HPW and relative to the LPW of primary clock signal (clk), which in turn reduces or decreases the LPW requirement on the primary clock pin of high-speed flip-flop 100. Delay time periods 402 and 404 may be set based on operating parameters of high-speed flip-flop 100.

Figure 5:
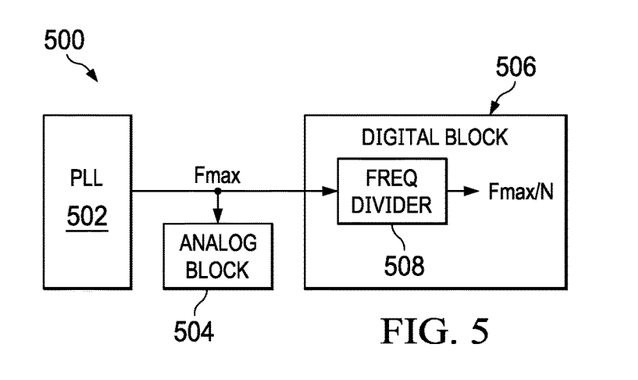
FIG. 5 is schematic diagram of an example system level implementation, e.g., a clock divider circuit.

FIG. 5 is schematic diagram of an example system level implementation of high-speed flip-flop 100. By way of example, FIG. 5 shows such system level implementation in the form of a clock divider circuit 500. More generally, high-speed flip-flop 100 may be implemented in any of a variety of sequential circuits. Clock divider circuit 500 may include a phase-locked loop (PLL) 502 coupled to both an analog block 504 and a digital block 506. From an input signal (not shown), PLL 502 generates a high-speed clock signal (Fmax) having a phase that is related to the input signal. The same signal Fmax may be supplied to both analog block 504 and to digital block 506. However, because digital block 506 may have components operating at a lower frequency, digital block 506 includes a frequency divider 508 that reduces the frequency of Fmax by a factor of N, where N is an integer, to attain the required frequency needed.

Figure 6:
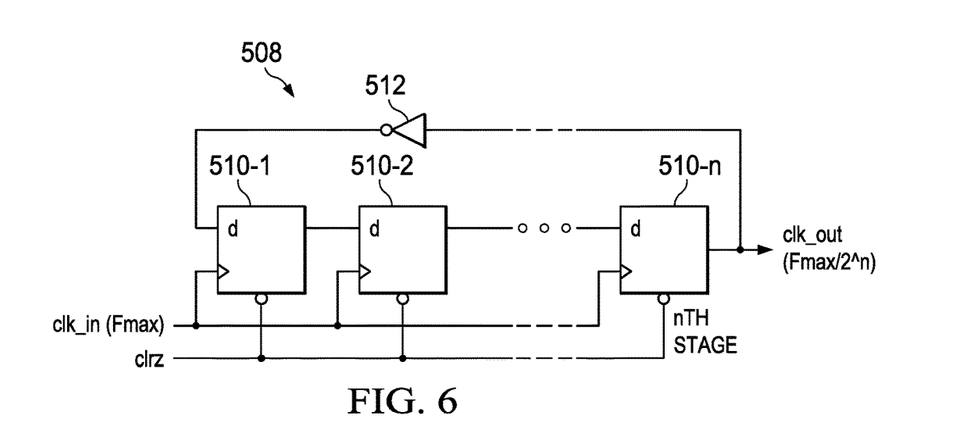
FIG. 6 is a schematic diagram of an example frequency divider of an example clock divider circuit.

Such implementation, as shown in FIG. 5, may be improved by configuring frequency divider 508 using a series of high-speed flip-flops, such as those shown and described in connection with FIGS. 1-4 herein. FIG. 6 is a schematic diagram of an example frequency divider 508 that includes a series of high-speed flip-flops 510-1, 510-2, . . . , and 510-n, each with a lower or reduced MPW requirement. That is, each of the high-speed flip-flops 510-1, 510-2, . . . , and 510-n is configured to generate complementary clock signals with an inflated LPW.

As shown in FIG. 6, the output of the first high-speed flip-flop 510-1 is coupled to the data input of the next-in-series high-speed flip-flop 510-2, and this series coupling continues through high-speed flip-flop 510-n. The output of high-speed flip-flop 510-n forms the input to inverter 512, the output of which is input to the data input of the first high-speed flip-flop 510-1. Each of the high-speed flip-flops 510-1 to 510-n is configured to receive as its clock input signal (clk_in) the output clock signal (Fmax) of PLL 502. Each of the high-speed flip-flops 510-1 to 510-n is also configured to receive a signal (clrz), which is the complement of a clear input signal. The output clock signal of the last high-speed flip-flop 510-n (clk out) has a frequency approximately equal to $Fmax/2^n$, where n is the number of high-speed flip-flops coupled in series. Thus, the frequency of the output clock signal may be controlled by controlling n (i.e., the number of high-speed flip-flops coupled in series).

Figure 7A:
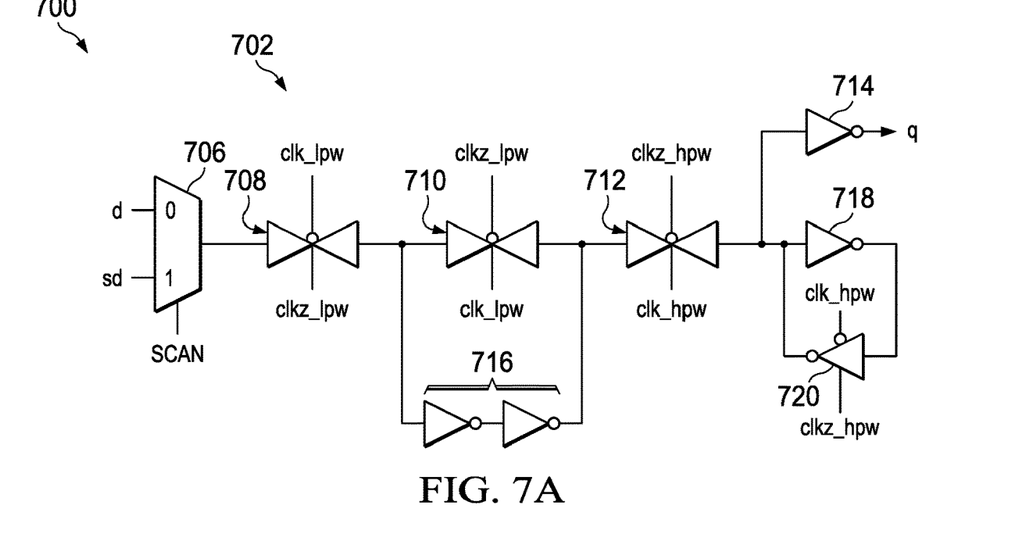
FIGS. 7A, 7B and 7C are schematic diagrams of various sections of an example standard-speed flip-flop.
Figure 7B:
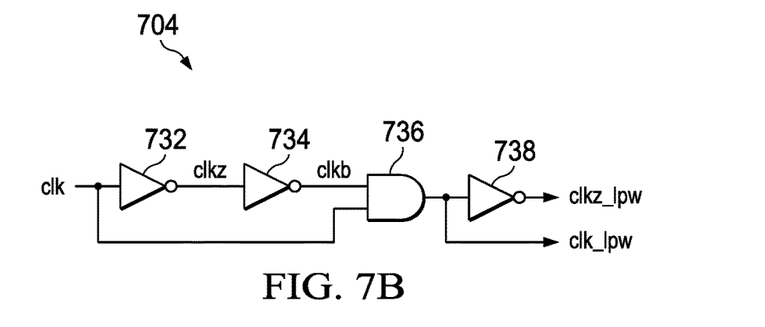
Figure 7C:
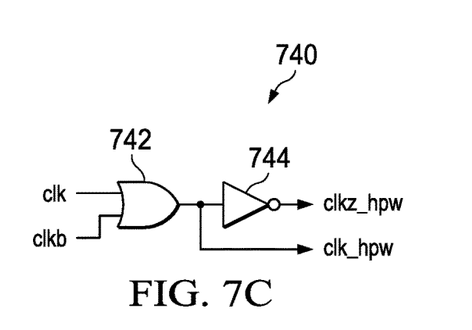

Aspects described in connection with high-speed flip-flop 100 may be extended to a standard-speed flip-flop to reduce the low pulse width requirement of the primary clock signal (clk) on the primary clock pin of such flip-flop. FIG. 7A is a schematic diagram of latch and latch control sections (latches) 702 of an example standard-speed flip-flop 700, FIG. 7B is a schematic diagram of a circuit 704 for generating a pair of complementary inflated low pulse width (LPW) signals (clk_lpw and clkz_lpw), each having an inflated low pulse width relative primary clock signal (clk), and FIG. 7C is a schematic diagram of a circuit 740 for generating a pair of complementary inflated high pulse width (HPW) signals (clk_hpw and clkz_hpw).

Latches 702 may include a multiplexer 706 having data (d) input at which a data signal is input and set-direct data (sd) input at which a reset signal is input. Which signal of these two input signals is output is controlled by a scan signal (scan) also input to multiplexer 706. The output of multiplexer 706 is coupled to a first transmission gate 708, which is controlled by the signals generated by circuit 704 (i.e., by clk_lpw and clkz_lpw). The output of first transmission gate 708 is coupled to a second transmission gate 710, which is also controlled by the inflated low pulse width signals (clk_lpw and clkz_lpw). The output of second transmission gate 710 is coupled to a third transmission gate 712, which is controlled by inflated HPW clock signal (clk_hpw) and its complement (clkz_hpw), both of which are generated by circuit 740. The output q bar (i.e., the complement of q) is generated at the output of transmission gate 712, and that output is input to inverter 714 to generate output q.

Latches 702 includes two regenerative loops to maintain static functionality of standard-speed flip-flop 700. One such loop is formed by two series coupled inverters 716, the input of the upstream inverter in the pair being coupled to the output of transmission gate 708 and the output of the downstream inverter being coupled to the output of transmission gate 710. Another regenerative loop is formed at the output of transmission gate 712 and is formed of series coupled inverter 718 and tri-state inverter 720. Tri-state inverter 720 is controlled by inflated HPW clock signal (clk_hpw) and its complement (clkz_hpw), both of which are generated by circuit 740 shown in FIG. 1C.

Latches 702 may be considered a second section of standard-speed flip-flop 700, and circuits 704 and 740 may be collectively considered a first section of standard-speed flip-flop 700.

Circuit 704 of standard-speed flip-flop 700 includes two series coupled inverters 732 and 734, the first of which receives at its input primary clock signal (clk), and the second of which generates at its output clock buffer signal (clkb), which is a delayed version of primary clock signal (clk). Primary clock signal (clk) and clock buffer signal (clkb) form the inputs to an NAND gate 736 to generate inflated LPW clock signal (clkz_lpw), which is input to inverter 738 to generate inflated LPW clock signal (clk_lpw). These signals are then used in components of latches 702, as described above.

Circuit 740 of standard-speed flip-flop 700 includes an OR gate 742 having two inputs, one of which is configured to receive primary clock signal (clk) and the other of which is configured to receive clock buffer signal (clkb), which is a delayed version of primary clock signal (clk). From these inputs, OR gate 742 generates inflated HPW clock signal (clk_hpw). The output of OR gate 742 is coupled to the input of inverter 744, which generates complement inflated HPW clock signal (clkz_hpw).

Figure 8:
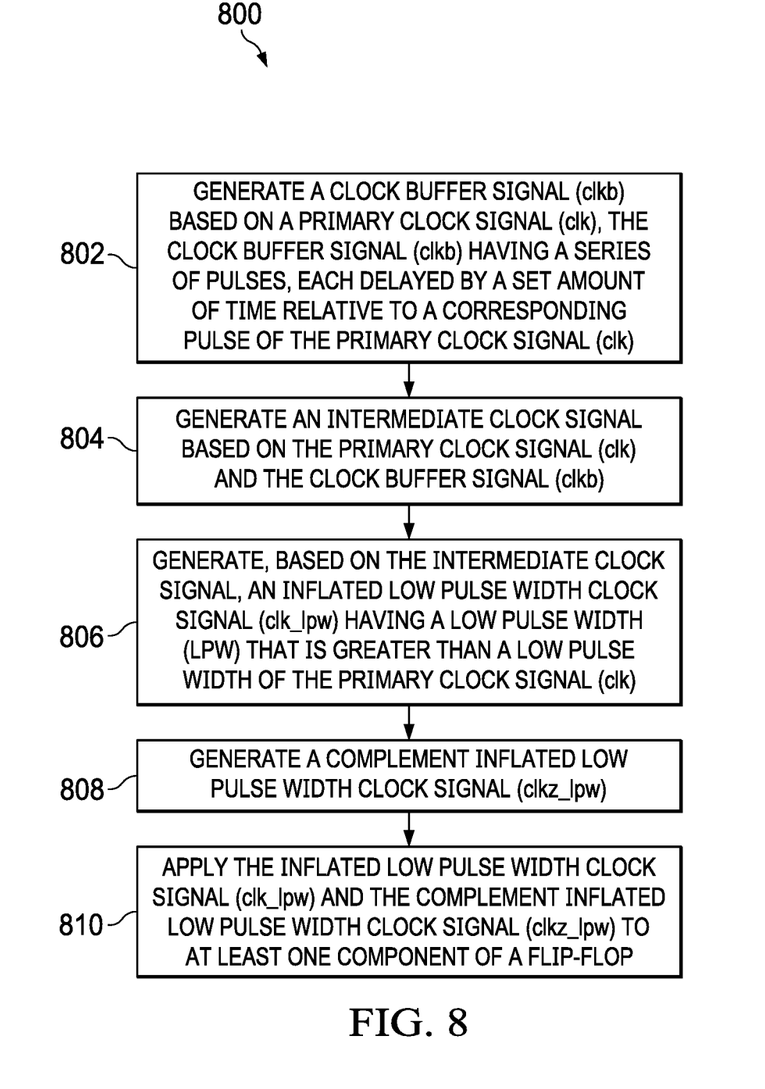
FIG. 8 is a flow diagram of an example of generating internal functional clock signals for use in a high-speed flip-flop.

FIG. 8 is a flow diagram of an example method 800 of operating a flip-flop, e.g., a high-speed D-type flip-flop. In operation 802, a clock buffer signal (e.g., clkb) is generated based on a primary clock signal e.g., (clk). The clock buffer signal has a series of pulses, each delayed by a set amount of time relative to a corresponding pulse of the primary clock signal. In operation 804, an intermediate clock signal is generated based on the primary clock signal and the clock buffer signal. Based on the intermediate clock signal, an inflated low pulse width clock signal (e.g., clk_lpw) having a low pulse width (LPW) that is greater than a low pulse width of the primary clock signal is generated in operation 806, and a complement inflated low pulse width clock signal (e.g., clkz_lpw) is generated in operation 808. Having these low pulse width signals, in operation 810, they are applied to at least one component in a flip-flop.

Method 800 may include additional steps/sub-steps. For example, in addition to generating the inflated LPW clock signals, method 800 may include generating an inflated high pulse width (HPW) clock signal and its complement, in which the HPW is greater than the high pulse width of the primary clock signal. These high pulse signals may be generated based on the primary clock signal and the clock buffer signal, and once generated, applied to at least one component in a flip-flop. Also, in method 800, the generation of the intermediate clock signal may include inputting the primary clock signal and the clock buffer signal into an AND gate to generate intermediate clock signal. In addition, the inflated LPW signal may be generated by inputting the intermediate clock signal and a scan signal into an OR gate.

Not all operations of method 800 need necessarily be performed in the order described. Two or more operations may be combined into a single operation, or may be performed in parallel substantially simultaneously. In some examples, additional operations and/or alternative operations may be performed.

High-speed flip-flops constructed according to the teachings herein exhibit improved MPW. In particular, the improvement for the LPW may be at least 40% for lower LPW clock slew rates relative to existing high-speed flip-flops. High-speed flip-flops described herein may also attain significantly higher operating frequencies than existing high-speed flip-flops. In some examples, the operating frequencies of the subject high-speed flip-flops may be at least 60% higher than conventional high-speed flip-flops. In some examples, the operating frequency differential increases as LPW clock skew decreases. In some examples, the higher operating frequencies are attained without appreciable change in the set-up/hold and clock input to output delay parameters.

Standard-speed flip-flops constructed according to the teachings herein also exhibit improvements in LPW at lower LPW clock slew rates. Moreover, such improvement is achieved without appreciably affecting set-up time.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), and/or one or more sources (such as voltage and/or current sources) may instead include only the semiconductor elements within a single physical device (e.g., a semiconductor die and/or integrated circuit (IC) package) and may be adapted to be coupled to at least some of the sources to form the described structure either at a time of manufacture or after a time of manufacture, for example, by an end-user and/or a third-party.

While the use of particular transistors is described herein, other transistors (or equivalent devices) may be used instead. For example, MOSFETs may be arranged differently to form the described functionality. Furthermore, other types of transistors may be used (such as bipolar junction transistors (BJTs)) to implement the described functionality.

Circuits described herein may be configured in alternate ways. One or more logic elements may be implemented by a set of different logic elements to provide the same or substantially the same functionality.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications of the described examples are possible, as are other examples, within the scope of the claims. Moreover, features described herein may be applied in other environments and applications consist with the teachings provided.

What is claimed is:

1. A flip-flop circuit comprising:
   a first section configured to receive a primary clock signal, the first section being configured to generate a clock buffer signal having a series of pulses, each delayed by a set amount of time relative to a corresponding pulse of the primary clock signal, generate an intermediate clock signal based on the primary clock signal and the clock buffer signal, generate an inflated low pulse width clock signal having a low pulse width (LPW) that is greater than a low pulse width of the primary clock signal, and generate a complement inflated low pulse width clock signal;
   a second section including at least one component configured to receive the inflated low pulse width clock signal and the complement inflated low pulse width clock signal; and
   a third section configured to generate, based on the primary clock signal and the clock buffer signal, an inflated high pulse width clock signal having a high pulse width (HPW) that is greater than a high pulse width of the primary clock signal, and generate a complement inflated high pulse width clock signal,
   wherein the second section includes a transmission gate configured to receive the inflated high pulse width clock signal and the complement inflated high pulse width clock signal.

2. The flip-flop circuit of claim 1, wherein the first section includes an AND gate having a first input configured to receive the primary clock signal, a second input configured to receive the clock buffer signal, and an output at which the intermediate clock signal is generated.

3. The flip-flop circuit of claim 1, wherein the at least one component includes an input tri-state inverter having a data input configured to receive a data signal.

4. The flip-flop circuit of claim 1, wherein the at least one component further includes an internal tri-state inverter.

5. The flip-flop circuit of claim 1, wherein a maximum frequency of the flip-flop circuit in which the primary clock signal has a 50% duty cycle is based on the worse of the LPW and the HPW.

6. The flip-flop circuit of claim 5, wherein the maximum frequency of the flip-flop circuit is 1/(2*Max(HPW, LPW)).

7. A circuit comprising:
n flip-flop circuits, where n is an integer greater than 1, each of the n flip-flop circuits configured to receive a primary clock signal, a first section of each of the n flip-flop circuits being configured to generate a clock buffer signal having a series of pulses, each delayed by a set amount of time relative to a corresponding pulse of the primary clock signal, generate an intermediate clock signal based on the primary clock signal and the clock buffer signal, generate an inflated low pulse width clock signal having a low pulse width that is greater than a low pulse width of the primary clock signal, and generate a complement inflated low pulse width clock signal, the inflated low pulse width clock signal and the complement inflated low pulse width clock signal being applied internally in the circuit;
wherein each of the n flip-flop circuits is further configured to generate, based on the primary clock signal and the clock buffer signal, an inflated high pulse width clock signal having a high pulse width that is greater than a high pulse width of the primary clock signal, and generate a complement inflated high pulse width clock signal, the inflated high pulse width clock signal and the complement inflated high pulse width clock signal being applied internally in the circuit.

8. The circuit of claim 7, further comprising:
an analog block having an input configured to receive a clock-in signal; and
a digital block having an input configured to receive the clock-in signal, the digital block including a frequency divider that includes the n flip-flop circuits.

9. The circuit of claim 8, wherein n is 3, and an output of the first flip-flop circuit is coupled to a data input of the second flip-flop circuit, an output of which is coupled to a data input of the third flip-flop circuit.

10. A method comprising:
generating a clock buffer signal based on a primary clock signal, the clock buffer signal having a series of pulses, each delayed by a set amount of time relative to a corresponding pulse of the primary clock signal;
generating an intermediate clock signal based on the primary clock signal and the clock buffer signal;
generating, based on the intermediate clock signal, an inflated low pulse width clock signal having a low pulse width that is greater than a low pulse width of the primary clock signal; and
generating a complement inflated low pulse width clock signal;
generating, based on the primary clock signal and the clock buffer signal, an inflated high pulse width clock signal having a high pulse width that is greater than a high pulse width of the primary clock signal, and a complement inflated high pulse width clock signal; and
applying the inflated high pulse width clock signal and the complement inflated high pulse width clock signal to a transmission gate of a flip-flop.

11. The method of claim 10, further comprising:
applying the inflated low pulse width clock signal and the complement inflated low pulse width clock signal to at least one component of a flip-flop.

12. The method of claim 11, wherein the at least one component includes an input clocked inverter having a data input configured to receive a data signal and an internal clocked inverter.

* * * * *